(12) United States Patent
Ueda et al.

(10) Patent No.: US 11,038,440 B2
(45) Date of Patent: Jun. 15, 2021

(54) VIBRATOR WITH LOW POWER CONSUMPTION, VIBRATION TYPE ACTUATOR, AND ELECTRONIC APPARATUS

(71) Applicant: CANON KABUSHIKI KAISHA, Tokyo (JP)

(72) Inventors: Miki Ueda, Tokyo (JP); Tatsuo Furuta, Machida (JP); Takayuki Watanabe, Yokohama (JP); Shinya Koyama, Tokyo (JP); Jumpei Hayashi, Yokohama (JP); Makoto Kubota, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 491 days.

(21) Appl. No.: 15/961,122

(22) Filed: Apr. 24, 2018

(65) Prior Publication Data

US 2018/0316284 A1 Nov. 1, 2018

(30) Foreign Application Priority Data

Apr. 26, 2017 (JP) .............................. JP2017-087153
Apr. 18, 2018 (JP) .............................. JP2018-079885

(51) Int. Cl.
*H02N 2/02* (2006.01)
*H01L 41/09* (2006.01)
(Continued)

(52) U.S. Cl.
CPC .............. *H02N 2/026* (2013.01); *G03B 3/10* (2013.01); *G03B 13/32* (2013.01);
(Continued)

(58) Field of Classification Search
CPC . H02N 2/026; H01L 41/0477; H01L 41/0973; H01L 41/1871; H01L 41/053; G03B 13/32
See application file for complete search history.

(56) References Cited

U.S. PATENT DOCUMENTS 8,182,713 B2 5/2012 Ren et al.
2013/0222678 A1* 8/2013 Araki ................. H01L 41/0475
348/357

(Continued)

FOREIGN PATENT DOCUMENTS

JP 2004297910 A 10/2004
JP 2009215111 A 9/2009

OTHER PUBLICATIONS

Xue et al. "Elastic, piezoelectric, and dielectric properties of Ba(Zr0.2Ti0.8)O3-50(Ba0.7Ca0.3)TiO3 Pb-free ceramic at the morphotropic phase boundary" Journal of Applied Physics, Mar. 15, 2011: 054110-1 to 054110-6, vol. 109. Cited in Specification.

*Primary Examiner* — J. San Martin
(74) *Attorney, Agent, or Firm* — Rossi, Kimms & McDowell LLP

(57) ABSTRACT

A vibrator which is constructed by bonding a piezoelectric element and an elastic body together via a bonding layer. The piezoelectric element has a piezoelectric ceramic and electrodes. The bonding layer has an unbonded region that is located close to a nodal line of a vibration in a primary out-of-plane vibration mode when the vibration is excited in the vibrator, and in the unbonded region, the piezoelectric element and the elastic body are not bonded together.

10 Claims, 9 Drawing Sheets

(51) Int. Cl.
  *H01L 41/047*   (2006.01)
  *G03B 13/32*   (2021.01)
  *H01L 41/187*   (2006.01)
  *H01L 41/053*   (2006.01)
  *G03B 3/10*   (2021.01)
  *H02N 2/00*   (2006.01)

(52) U.S. Cl.
  CPC ........ *H01L 41/0477* (2013.01); *H01L 41/053* (2013.01); *H01L 41/0973* (2013.01); *H01L 41/1871* (2013.01); *H02N 2/0015* (2013.01); *G03B 2205/0061* (2013.01)

(56) References Cited

U.S. PATENT DOCUMENTS

| | | | |
|---|---|---|---|
| 2013/0250417 A1* | 9/2013 | Ohashi | H01L 41/0973 359/507 |
| 2014/0210311 A1* | 7/2014 | Snis | H02N 2/003 310/323.02 |
| 2014/0218588 A1* | 8/2014 | Ifuku | G02B 27/0006 348/340 |

\* cited by examiner

Cn -------- Cn'  ANTINODAL LINE IN OUT-OF-PLANE VIBRATION MODE A

Dn —-— Dn'  NODAL LINE IN OUT-OF-PLANE VIBRATION MODE A

En -------- En'  ANTINODAL LINE IN OUT-OF-PLANE VIBRATION MODE B

Fn —-— Fn'  NODAL LINE IN OUT-OF-PLANE VIBRATION MODE B

VIBRATOR WITH LOW POWER CONSUMPTION, VIBRATION TYPE ACTUATOR, AND ELECTRONIC APPARATUS

BACKGROUND OF THE INVENTION

Field of the Invention

The present invention relates to a vibrator, a vibration-type actuator, and an electronic apparatus.

Description of the Related Art

There is known a vibration-type actuator that has a vibrating body (hereafter referred to as a vibrator) constructed by bonding (joining) an elastic body and a piezoelectric ceramic together. For example, Japanese Laid-Open Patent Publication (Kokai) No. 2004-297910 describes a vibration-type actuator that moves the vibrator and a driven body relatively to each other through combined vibrations that is caused to occur by bringing the vibrator and the driven body into contact with each other and exciting vibrations of two different modes in the vibrator.

As the piezoelectric ceramic, a perovskite-type metal oxide represented as a general formula $ABO_3$ (A and B are metal elements) is widely used. A lead zirconate titanate-based material (hereafter referred to as "the PZT-based material") with a high piezoelectric constant is widely used as a typical piezoelectric ceramic. The PZT-based material, however, contains a large amount of lead, and hence its environmental effect is perceived as a problem.

To solve this problem, use of piezoelectric ceramic containing no lead (hereafter referred to as a "lead-free piezoelectric ceramic") is being contemplated. Barium titanate ($TaTiO_3$) and its derivative (solid solution) are known as perovskite-type lead-free piezoelectric ceramics. For example, in Japanese Laid-Open Patent Publication (Kokai) No. 2009-215111 and "Journal of Applied Physics", 2011, volume 109, 054110-1 to 054110-6, it is described that piezoelectric characteristics are improved by replacing a part of the A site of barium titanate with calcium (Ca) and replacing a part of the B site of barium titanate with zirconium (Zr).

However, the piezoelectric constant of a lead-free piezoelectric ceramic is generally lower than that of lead-based piezoelectric ceramic. For this reason, if a vibrator that employs a lead-free piezoelectric ceramic is used for the purpose of obtaining vibration displacement equivalent to that obtained by a vibrator that employs a lead-based piezoelectric ceramic, a problem of increase in power consumption would arise.

SUMMARY OF THE INVENTION

The present invention provides a vibrator that is capable of achieving desired vibration displacement with reduced power consumption, a vibration-type actuator, and an electronic apparatus.

Accordingly, the present invention provides a vibrator comprising a piezoelectric element configured to have a piezoelectric ceramic and electrodes, and an elastic body, wherein the piezoelectric element and the elastic body are bonded together via a bonding layer, wherein in a region close to a nodal line of vibration in a primary out-of-plane vibration mode of the vibrator, there is an unbonded region where the piezoelectric element and the elastic body are not bonded together.

According to the present invention, the vibrator is capable of achieving desired vibration displacement with reduced power consumption.

Further features of the present invention will become apparent from the following description of exemplary embodiments (with reference to the attached drawings).

DESCRIPTION OF THE EMBODIMENTS

Figure 1A:
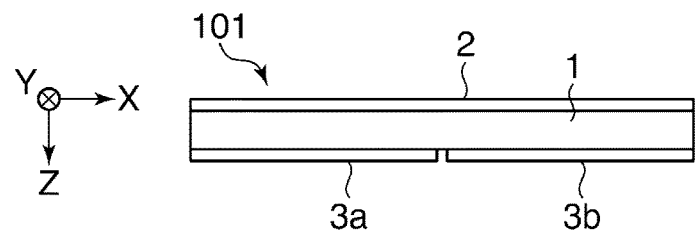
FIGS. 1A to 1D are views schematically showing arrangements of a piezoelectric element and a vibrator according to an embodiment of the present invention.
Figure 1B:
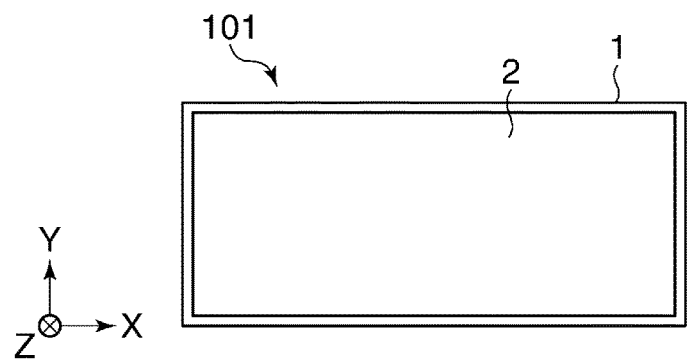
Figure 1C:
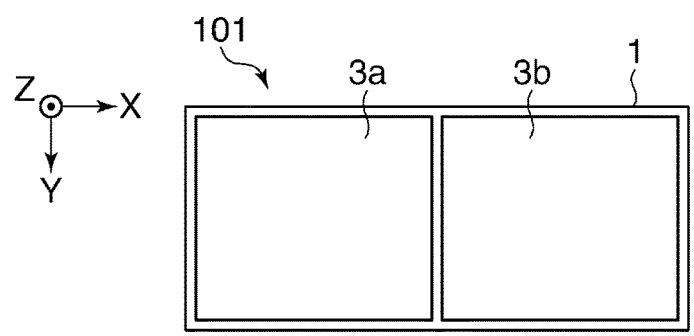
Figure 1D:
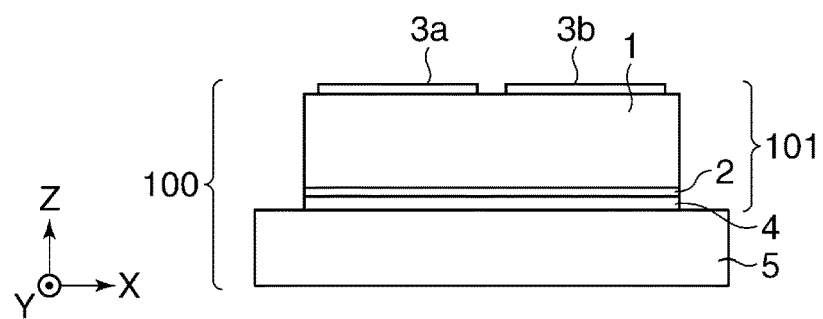

An embodiment of the present invention will now be described in detail with reference to the accompanying drawings. FIGS. 1A to 1D are views schematically showing arrangements of a piezoelectric element 101 and a vibrator 100 according to the embodiment of the present invention. FIG. 1A is a side view of the piezoelectric element 101. FIGS. 1B and 1C are plan views (a top view, a rear view) of the piezoelectric element 101. The piezoelectric element 101 has a construction in which a first electrode 2 is formed on one surface of a piezoelectric ceramic 1, and second electrodes 3a and 3b are formed on the other surface of the piezoelectric ceramic 1. For the convenience of explanation, an X direction, a Y direction, and a Z direction perpendicular to one another are defined as shown in FIGS. 1A to 1C. FIG. 1D is a side view of the vibrator 100. The vibrator 100 has a construction in which the piezoelectric element 101 and an elastic body 5 are bonded (may be expressed by "joined" or "fixed") together with a bonding layer 4. As shown in FIGS. 2A to 2D, referred to later, the elastic body 5 has projecting portions 51, but the projecting portions 51 are omitted from FIG. 1D.

First, a description will be given of an arrangement of the piezoelectric element 101 constituting the vibrator 100. The piezoelectric ceramic 1 has a flat and substantially rectangular shape. A lengthwise direction, a crosswise direction, and a thickness direction of the piezoelectric ceramic 1 are defined as the X direction, the Y direction, and the Z direction, respectively. The substantially rectangular shape does not mean that it is perfectly rectangular, but means that, for example, it has four sides chamfered. The piezoelectric ceramic 1 is a sintered body with a substantially uniform composition and is such a piezoelectric material that at a temperature of, for example, 20° C., an absolute value of a piezoelectric constant d31 is 10 pm/V or more, or an absolute value of a piezoelectric constant d33 is 30 pm/V or more.

It should be noted that the piezoelectric constant of the piezoelectric ceramic 1 is obtained by, for example, using a density, a resonance frequency, and an antiresonance frequency of the piezoelectric ceramic 1 and performing calculations (resonance-antiresonance method) based on the standard of Japan Electronics and Information Technology Industries Association (JEITA EM-4501). In this case, the density can be measured using the Archimedes method. The resonance frequency and the antiresonance frequency can be measured using an impedance analyzer. Not only the resonance-antiresonance method but also a piezoelectric constant measurement device using the Berlincourt method for a measurement principle may be used to measure the piezoelectric constant of the piezoelectric ceramic 1.

Conventionally, a piezoelectric ceramic composed mainly of lead zirconate titanate (PZT) with a high piezoelectric constant is widely used as a piezoelectric ceramic constituting a vibrator. However, when a piezoelectric element including a piezoelectric ceramic is discarded and exposed to acid rain or is left in a harsh environment, a lead component included in the piezoelectric ceramic may become dissolved in soil and have a harmful effect on an ecosystem. In view of this problem, in the present embodiment, a lead-free piezoelectric ceramic is used as the piezoelectric ceramic 1, and the lead-free piezoelectric ceramic is defined as a piezoelectric ceramic with a lead content of less than 1000 ppm. The reason for this is that even if the piezoelectric element 101 is discarded and exposed to acid rain or is left in a harsh environment, the lead component included in the piezoelectric ceramic 1 would cause virtually no environmental pollution as long as the lead content is less than 1000 ppm. It should be noted that the lead content of the piezoelectric ceramic 1 can be detected using a well-known quantitative analytical technique. For example, the lead content of the piezoelectric ceramic 1 can be found based on a ratio of the weight of lead quantified by the X-ray fluorescence (XRF) technique or ICP emission spectrophotometric technique to a total weight of the piezoelectric ceramic 1.

It is preferred that barium titanate or its derivative is used considering that it has a high piezoelectric constant and manufactured relatively easily among lead-free piezoelectric ceramics, and it is also preferred that the Young's modulus of a sintered body falls inside a range from 100 GPa to 140 GPa. Examples of barium titanate or its derivative include barium titanate ($BaTiO_3$), barium calcium titanate ($[Ba, Ca]TiO_3$), barium zirconate titanate ($Ba[Ti, Zr]O_3$), barium calcium zirconate titanate ($[Ba, Ca][Ti, Zr]O_3$), sodium niobate-barium titanate ($NaNbO_3$—$BaTiO_3$), sodium bismuth titanate-barium titanate ($[Bi, Na]TiO_3$—$BaTiO_3$), and potassium bismuth titanate-barium titanate ($[Bi, K]TiO_3$—$BaTiO_3$).

The lead-free piezoelectric ceramic may be substantially composed of one of the above-listed compositions, may be a combination of the above-listed compositions, or may include other elements on the basis of each composition. From the viewpoint of achieving high piezoelectric constant and mechanical quality coefficient (Q factor) at the same time, a lead-free piezoelectric ceramic composed mainly of barium calcium zirconate titanate or sodium niobate-barium titanate is suitably used. From the viewpoint of improving mechanical quality coefficient and insulation quality, a lead-free piezoelectric ceramic including elements such as manganese (Mn) or bismuth (Bi) as well as the main components mentioned above is suitably used. The piezoelectric ceramic 1 can be manufactured by a well-known manufacturing method. For example, the piezoelectric ceramic 1 can be manufactured by molding and sintering material powder (in general, a metallic oxide) having metal elements and then machining the resultant sintered body into a desired shape, but this is not particularly limited.

The first electrode 2 and the second electrodes 3a and 3b are provided on the front surface and the rear surface, respectively, of the piezoelectric ceramic 1 so as to apply voltage for causing a predetermined displacement of the piezoelectric ceramic 1. The second electrodes 3a and 3b are used to apply AC voltage (driving voltage), and the first electrode 2 is used as a common electrode that makes a connection to a ground. When voltage is applied to develop a predetermined potential difference between the first electrode 2 and the second electrodes 3a and 3b, an electric field is applied to the piezoelectric ceramic 1 in the thickness direction, causing displacement of the piezoelectric ceramic 1 due to the piezoelectric characteristic (piezoelectric constant).

The first electrode 2 and the second electrodes 3a and 3b are made of electrically-conductive materials and have a thickness of approximately 5 nm to 10 μm. It is preferred that a metal such as titanium (Ti), platinum (Pt), gold (Au), nickel (Ni), palladium (Pd), silver (Ag), or copper (Cu), or an alloy of these metals is used as the electrically-conductive material. Silver is suitably used considering that it is inexpensive and has satisfactory electrical conductivity. For example, the first electrode 2 and the second electrodes 3a and 3b are formed of silver by printing (coating) a silver paste on the front and rear surfaces of the piezoelectric ceramic 1 with a screen printing technique or the like, drying the silver paste, and then baking it at a predetermined temperature. The first electrode 2 and the second electrodes 3a and 3b may be formed of the above metals or alloys using a sputtering technique or the like.

To cause displacement of the piezoelectric element 101 based on the piezoelectric characteristic, the piezoelectric ceramic 1 needs to be subjected to a polarizing process. The polarizing process may be carried out either before or after the piezoelectric element 101 is bonded to the elastic body 5. In the case where the polarizing process is carried out before the bonding step, steps subsequent to the polarizing process need to be performed at temperatures equal to or lower than the Curie temperature so as to avoid depolarization of the piezoelectric ceramic 1.

A description will now be given of the bonding layer 4 and the elastic body 5 of the vibrator 100. In general, the bonding layer 4 is formed by applying a liquid resin adhesive to either of the piezoelectric element 101 and the elastic body 5 and hardening the liquid resin adhesive while applying a predetermined force in the thickness direction (Z direction) so that the piezoelectric element 101 and the elastic body 5 can be brought into intimate contact with each other. It should be noted that the bonding layer 4 has a thickness as viewed in FIG. 1D so as to clearly show the bonding layer 4, the bonding layer 4 generally has a thickness of about several microns. The elastic body 5 is made of, for example, a metallic material such as stainless steel, and an XY plane of the elastic body 5 is equal to or slightly larger in size than an XY plane of the piezoelectric element 101.

Here, a description will be given of how the piezoelectric element 101 and the elastic body 5 are bonded together. First, a liquid resin adhesive is applied to a bonding surface of the piezoelectric element 101 or a bonding surface of the elastic body 5. It should be noted that the resin adhesive is a resin material which has liquidity during application (before hardening), loses its liquidity and hardens to solidify through a predetermined hardening process, and may be of either a one-component hardening type or a two-component hardening type. Concrete examples of the resin adhesive include an epoxy-based resin, an acryl-based resin, and a silicon-based resin.

Next, the bonding surface of the piezoelectric element 101 and the bonding surface of the elastic body 5 are attached together via the applied resin adhesive, and the resin adhesive is then hardened while the piezoelectric element 101 and the elastic body 5 are being pressurized in the thickness direction (Z direction). The pressure applied to the piezoelectric element 101 and the elastic body 5 is preferably such that the piezoelectric element 101 and the elastic body 5 are prevented from moving, and the piezoelectric ceramic 1 is prevented from being cracked, and is preferably, for example, not more than 30 kg/cm$^2$ and more preferably not less than 1 kg/cm$^2$ and not more than 10 kg/cm$^2$. When the resin adhesive is of a thermosetting type, the time required for hardening can be reduced by heating at least one of the piezoelectric element 101 and the elastic body 5 while keeping them in pressure contact with each other. The vibrator 100 is obtained by thus forming the bonding layer 4 with the resin adhesive hardened.

It should be noted that when the piezoelectric element 101 and the elastic body 5 are to be bonded together with a thermosetting resin adhesive by using the piezoelectric element 101 that has already been subjected to the polarizing process, it is preferred that a temperature at which the resin adhesive is hardened is not more than the Curie temperature of the piezoelectric ceramic 1 so as to prevent depolarization of the piezoelectric ceramic 1. The way to bond the piezoelectric element 101 and the elastic body 5 together is not limited to the above described one. When necessary, the first electrode 2 and the second electrodes 3a and 3b are provided with a feeding member (see FIG. 8) for electrically connecting with a voltage input means (power source).

FIGS. 2A to 2D are views useful in explaining examples of two different out-of plane vibration modes of vibrations excited in the vibrator 100. It should be noted that in FIGS. 2A and 2B, the amount of deformation is enlarged so as to make it easier to understand vibration displacement occurring in the vibrator 100, and the bonding layer 4 is omitted from FIGS. 2A and 2B. On a surface of the elastic body 5 which is opposite to a surface bonded to the piezoelectric element 101, the projecting portions 51 are provided with a predetermined space left therebetween in the lengthwise direction (X direction). It should be noted that functions of the projecting portions 51 will be described later.

Figure 2A:
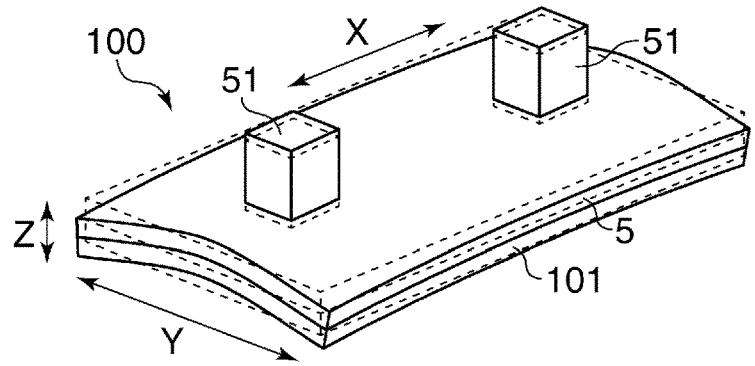
FIGS. 2A to 2D are views useful in explaining examples of out-of plane vibration modes of vibrations excited in the vibrator.
Figure 2B:
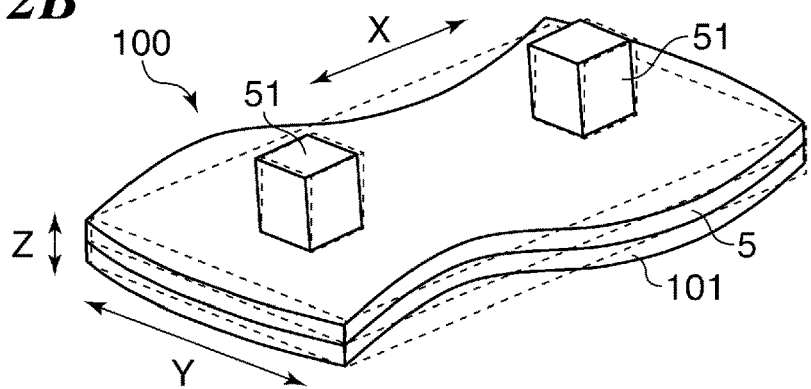
Figure 2C:
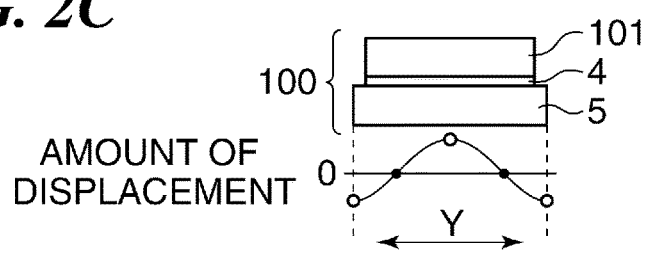
Figure 2D:
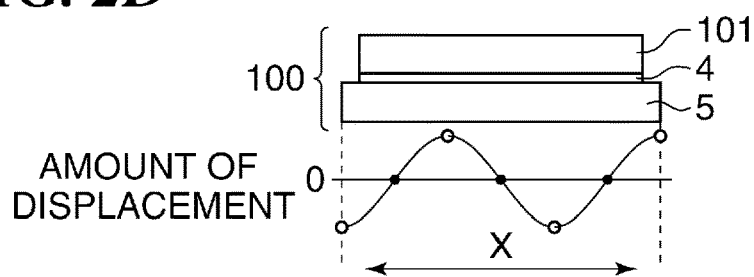

FIGS. 2A and 2C are views useful in explaining one (hereafter referred to as "the out-of plane vibration mode A") of the two out-of plane vibration modes. The out-of plane vibration mode A is a primary out-of plane vibration mode in which there are two nodal lines that are substantially parallel to long sides (X direction) of the vibrator 100 and do not cross each other. In FIG. 2C, positions of the nodal lines are indicated by black circles, positions of antinodal lines are indicated by white circles, and an amplitude reaches its peak at the position of the antinodal line. FIGS. 2B and 2D are views useful in explaining the other one (hereafter referred to as "the out-of plane vibration mode B") of the two out-of plane vibration modes. The out-of plane vibration mode B is a secondary out-of plane vibration mode in which there are three nodal lines that are substantially parallel to short sides (Y direction) of the vibrator 100 and do not cross one another. In FIG. 2D, positions of the nodal lines are indicated by black circles, positions of antinodal lines are indicated by white circles, and an amplitude reaches its peak at the positions of the antinodal lines.

A resonance frequency, the number of nodal lines, and their positions in each of the out-of plane vibration modes A and B are found, for example, by applying AC voltage to the vibrator 100 while changing driving frequencies and measuring an in-plane distribution of amounts of displacement in an out-of-plane direction with respect to each driving frequency by means of a Laser Doppler vibrometer. The projecting portions 51 are provided at locations where the antinodal lines in the out-of plane vibration mode A and the nodal lines in the out-of plane vibration mode B cross each other. Vibrations in the out-of plane vibration modes A and B are excited at the same time with a predetermined phase difference to produce oval motions at ends of the projecting portions 51 in a ZX plane as will be described later in detail. As will be described later with reference to FIG. 9, the ends of the projecting portions 51 are in contact with a driven body, and through the oval motions produced at the ends of the projecting portions 51, the projecting portions 51 provide thrust to the driven body. This enables the piezoelectric element 101 and the driven body to move relatively to each other in the X direction.

As for the out-of plane vibration mode A, the nodal lines lie at locations where the amount of displacement is zero in the short-side direction (Y direction) of the vibrator 100 or boundaries at which positive and negative signs of the amount of displacement are reversed, and a frequency at which there are two nodal lines in the short-side direction at any of the locations in the long-side direction (X direction) of the piezoelectric element 101 is obtained. A frequency that is close to the frequency thus obtained and at which the amount of displacement in a midsection (antinodal line) between the two nodal lines is the largest is a resonance frequency fA in the out-of plane vibration mode A. As for the out-of plane vibration mode B, the nodal lines lie at locations where the amount of displacement is zero in the long-side direction (X direction) of the vibrator 100 or boundaries at which positive and negative signs of the amount of displacement are reversed, and a frequency at which there are three nodal lines in the long-side direction at any of the locations in the short-side direction (Y direction) of the piezoelectric element 101 is obtained. A frequency that is close to the frequency thus obtained and at which the amount of displacement in a midsection (antinodal line) between the two adjacent nodal lines among the three nodal lines is the largest is a resonance frequency fB in the out-of plane vibration mode B.

Figure 3A:
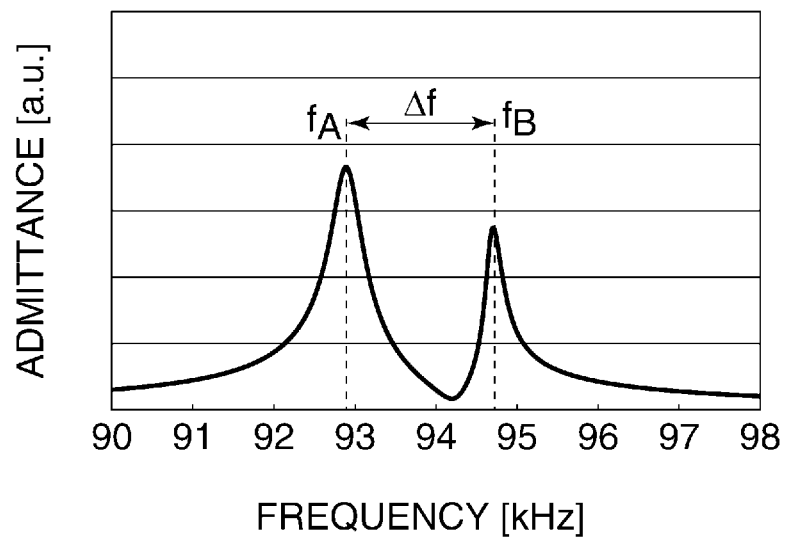
FIGS. 3A and 3B are diagrams useful in explaining how the admittance of the vibrator is dependent on frequency and the relationship between resonance frequency difference $\Delta f$ and power consumption.
Figure 3B:
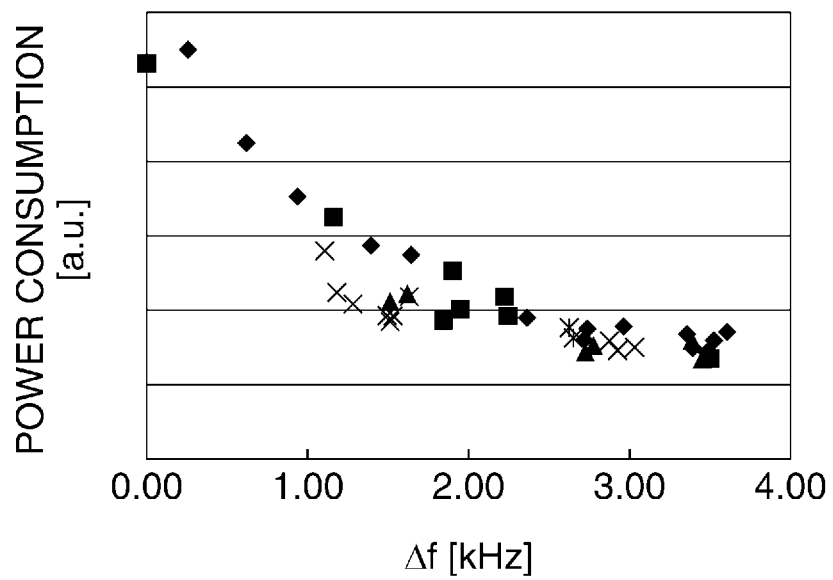

FIG. 3A is a diagram showing the frequency dependence of admittance of the vibrator 100. The admittance of the vibrator 100 reaches maximum values at the resonance frequencies fA and fB in the respective out-of plane vibration modes A and B, and a difference between the resonance frequencies fA and fB (fB−fA) is defined as a resonance frequency difference Δf. FIG. 3B is a diagram showing results obtained by measuring power consumption when vibration-type actuators for which the vibrators 100 with different resonance frequency differences Δf are used are driven. It should be noted that constructions of the vibration-type actuators conform to that of a vibration-type actuator in FIG. 9, to be described later, and the variations in the resonance frequency difference Δf result from variations in the shape of the vibrators 100. In FIG. 3B, the vertical axis represents power consumption while the vibration-type actuator is driven at a constant vibration speed, and the horizontal axis represents the resonance frequency difference Δf. It can be seen from FIG. 3B that the power consumption tends to decrease as the resonance frequency difference Δf increases. In the present embodiment, the resonance frequency difference Δf is increased by bonding the piezoelectric element 101 and the elastic body 5 together in a characteristic manner to implement a vibration-type actuator that is able to be driven with low power consumption.

Figure 4A:
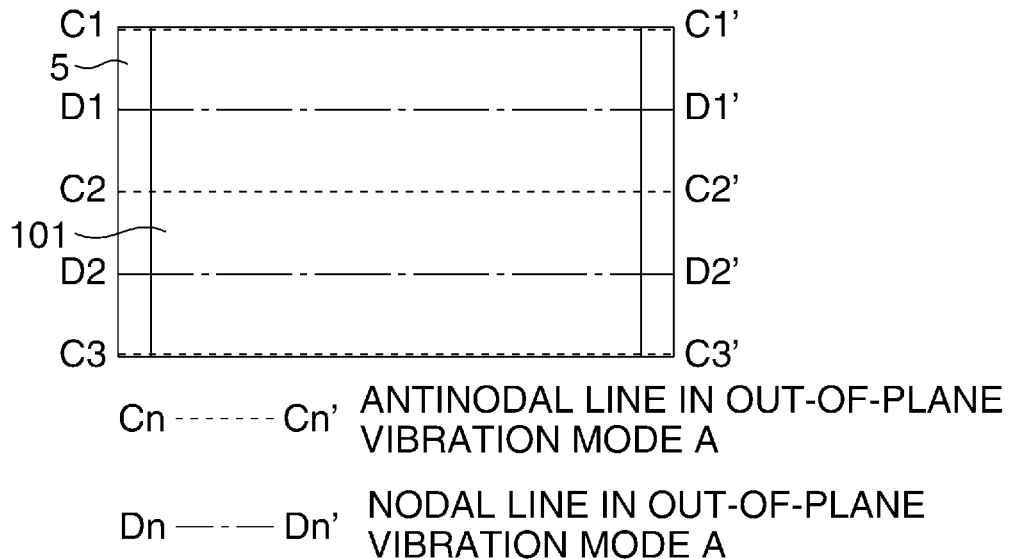
FIGS. 4A and 4B are views useful in explaining nodal lines and antinodal lines in the out-of plane vibration mode A of vibrations excited in the vibrator.
Figure 4B:
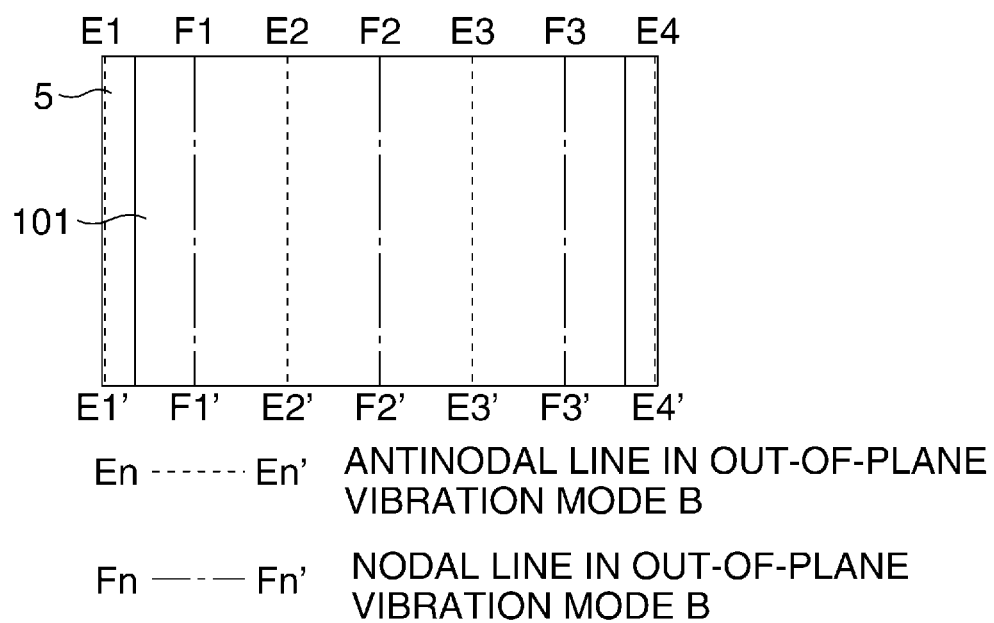

FIG. 4A is a plan view showing the positions of the antinodal lines (Cn-Cn' (n=1, 2, 3)) and the positions of the nodal lines (Dn-Dn' (n=1, 2)) in the out-of plane vibration mode A as viewed from the piezoelectric ceramic 1 side in an undriven state. FIG. 4B is a plan view showing the positions of the antinodal lines (En-En' (n=1, 2, 3, 4)) and the positions of the nodal lines (Fn-Fn' (n=1, 2, 3)) in the out-of plane vibration mode B as viewed from the piezoelectric ceramic 1 side in an undriven state. It should be noted that the nodal lines and the antinodal lines are not always straight lines parallel to the short side or long side as shown in FIGS. 4A and 4B, but they may be curved lines bending in a complex manner, depending on the shape of the vibrator 100 and combination of the vibration modes. In the following description of the present embodiment, however, it is assumed that the nodal lines and the antinodal lines are approximately straight lines.

For the vibrator 100, variations in the resonance frequency difference of in a case where the bonded state of the piezoelectric element 101 and the elastic body 5 (i.e. the form of the bonding layer 4) was varied were estimated using a finite-element method software package ANSYS (ANSYS, Inc.). In this simulation, at a temperature of 20° C., the Young's modulus Ysb of the elastic body 5 was 200 GPa, and the Young's modulus Yce of the piezoelectric ceramic 1 was 120 GPa.

FIGS. 5A to 5E are views useful in explaining arrangements of the bonding layers 4 according to examples 1 to 5. Regions indicated by dot patterns inside the piezoelectric element 101 represent regions where the piezoelectric element 101 and the elastic body 5 are bonded together by the bonding layer 4. On the other hand, plain regions (white regions) inside the piezoelectric element 101 represent regions where there is no adhesive agent, or the piezoelectric element 101 and the elastic body 5 are virtually unbonded together by the bonding layer 4 (hereafter referred to as "unbonded regions"). The unbonded regions are formed by providing a layer of a fluorine-based resin or the like, which interferes with adhesion of an adhesive, on a surface of the piezoelectric element 101 which is bonded to the elastic body 5. The unbonded regions may also be formed by, for example, a method in which a soluble material is prepared on the bonding layer, and the soluble material is removed after the piezoelectric element 101 and the elastic body 5 are bonded together, or a method in which a gap is formed at an interface between the bonding layer 4 and the piezoelectric element 101 or the elastic body 5.

Figure 6A:
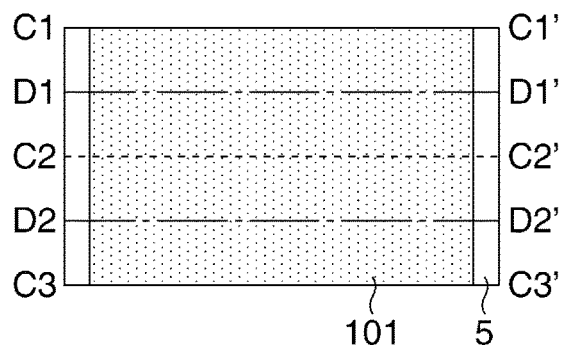
FIGS. 6A to 6F are views useful in explaining arrangements of bonding layers in the vibrator according to comparative examples.

FIGS. 6A to 6F are views useful in explaining arrangements of the bonding layers 4 according to comparative examples 1 to 6. FIG. 6A shows a conventional general form in which the bonding layer 4 between the piezoelectric element 101 and the elastic body 5 has no unbonded region and is substantially uniform, and this is a comparative example 1. The resonance frequency difference Δf in the arrangement in the comparative example 1 is defined as a reference value Δf0, and calculated values Δfex1 to Δfex5 of the resonance frequency difference in the respective examples 1 to 5 and calculated values Δfc1 to Δfc5 of the resonance frequency difference in the respective comparative examples 2 to 6 are compared with the reference value M0.

Figure 5A:
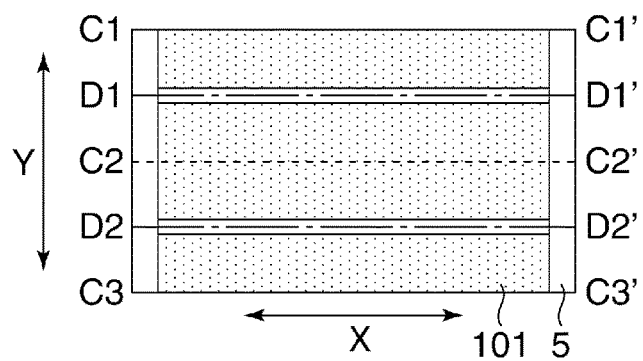
FIGS. 5A to 5E are views useful in explaining arrangements of bonding layers in the vibrator according to examples.

FIG. 5A shows the arrangement of the bonding layer 4 in the example 1. In the example 1, two band-shaped unbonded regions are provided in regions close to the respective nodal lines and with the nodal lines D1-D1' and D2-D2' in the out-of plane vibration mode A at their centers. It should be noted that in the present embodiment, a region close to a nodal line is defined as a region that is closer to a nodal line in a predetermined out-of-plane vibration mode than to an antinodal line in the predetermined out-of-plane vibration mode and includes the nodal line as the vibrator 100 in an undriven state is viewed from the piezoelectric ceramic 1 side. In the example 1, when the width (the length in the Y direction) of the two band-shaped unbonded regions was varied to make the sum of the unbonded area ratios of two band-shaped unbonded regions equal to 4.9%, 9.8%, and 14.6%, values of Δfex1/Δf0 were 1.003, 1.010, and 1.025, respectively. Here, when the unbonded area ratio is 14.6%, with respect to a wavelength λ of one wave as illustrated in FIGS. 5A and 2C, the unbonded region is defined to have a width of 0.073λ for each of the two nodal lines and to be arranged at a location where the unbonded region includes the nodal line in the Y direction crossing the nodal line, more preferably at a location where the nodal line lies at a center of the unbonded region in the Y direction. The present example is not limitative, but it is preferable to configure the bonding layer 4 so that the unbonded area with a width not more than 0.073λ is provided for each of the two nodal lines, and the piezoelectric element 101 and the elastic body 5 are not bonded in the unbonded area. It should be noted that the unbonded area ratio means a ratio of an area Su of the unbonded regions to a total area Sce of the surface of the piezoelectric element 101 which is bonded to the elastic body 5, that is, Su/Sce. For example, in FIG. 5A, a rectangular area defined by a width between antinodal lines C1-C1' and C3-C3' and a length of the bonded area in the X direction corresponds to the total area Sce.

Figure 5B:
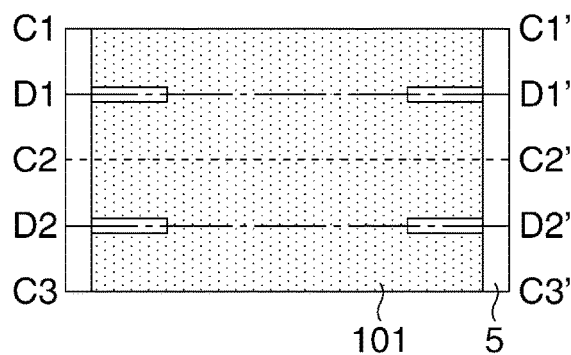

FIG. 5B shows the arrangement of the bonding layer 4 in the example 2. In the example 2, at ends of the piezoelectric ceramic 1 in the lengthwise direction (ends in the X direction), four band-shaped unbonded regions are provided in regions close to the respective nodal lines and with the nodal lines D1-D1' and D2-D2' in the out-of plane vibration mode A at their centers. In the example 2, when the width of the four band-shaped unbonded regions was varied to make the unbonded area ratio equal to 4.3%, 8.7%, and 14.6%, values of Δfex2/Δf0 were 1.003, 1.012, and 1.025, respectively.

Figure 5C:
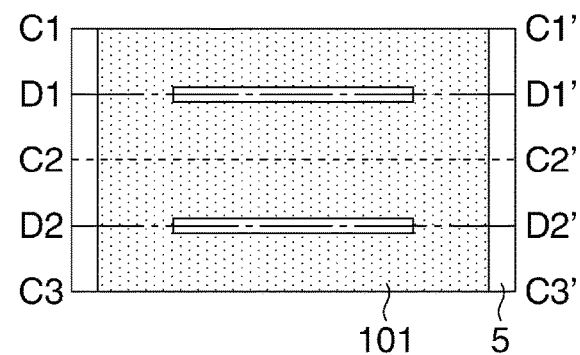

FIG. 5C shows the arrangement of the bonding layer 4 in the example 3. In the example 3, in a central part of the piezoelectric ceramic 1 in the lengthwise direction (a central part in the X direction), two band-shaped unbonded regions are provided in regions close to the respective nodal lines and with the nodal lines D1-D1' and D2-D2' in the out-of plane vibration mode A at their centers. When the width of the two band-shaped unbonded regions was varied to make the unbonded area ratio equal to 8.8% and 14.6%, values of $\Delta fex3/\Delta f0$ were 1.024 and 1.025, respectively.

Figure 5D:
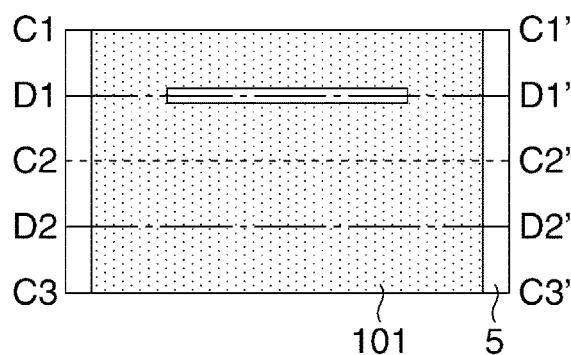

FIG. 5D shows the arrangement of the bonding layer 4 in the example 4. In the example 4, in a central part of the piezoelectric ceramic 1 in the lengthwise direction (a central part in the X direction), one band-shaped unbonded region is provided in a region close to the nodal line D1-D1' and with the nodal line D1-D1' in the out-of plane vibration mode A at its center. When the unbonded area ratio of the one band-shaped unbonded region was 4.4%, a value of $\Delta fex4/\Delta f0$ was 1.012.

Figure 5E:
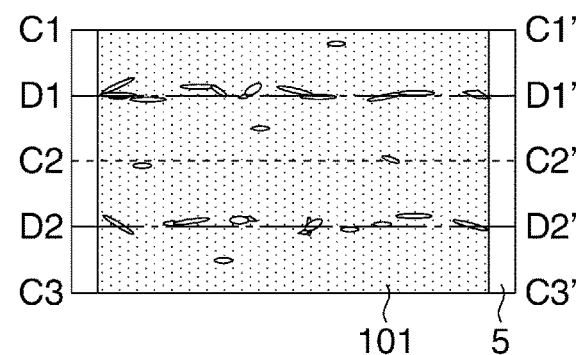

FIG. 5E shows the arrangement of the bonding layer 4 in the example 5. In the example 5, unbonded regions are scattered along the nodal lines D1-D1' and D2-D2' in the out-of plane vibration mode A and close to the nodal lines D1-D1' and D2-D2'. When the unbonded area ratio obtained by totalizing areas of the scattered unbonded regions was 7.4%, a value of $\Delta fex5/\Delta f0$ was 1.018.

Figure 6B:
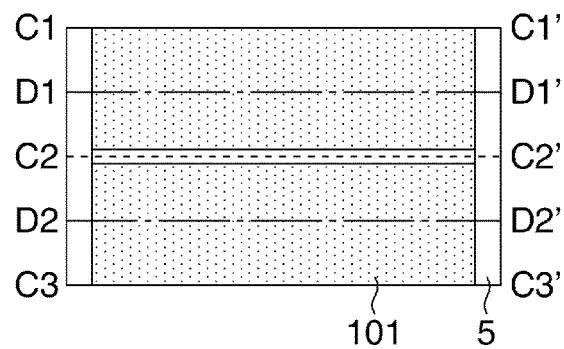

FIG. 6B shows the arrangement of the bonding layer 4 in the comparative example 2. In the comparative example 2, one band-shaped unbonded region is provided in a region close to the antinodal line C2-C2' and with the antinodal line C2-C2' in the out-of plane vibration mode A at its center. When the unbonded area ratios of the one band-shaped unbonded region were 2.4%, 7.3%, and 12.2%, values of $\Delta fc2/\Delta f0$ were 0.994, 0.968, and 0.915, respectively.

Figure 6C:
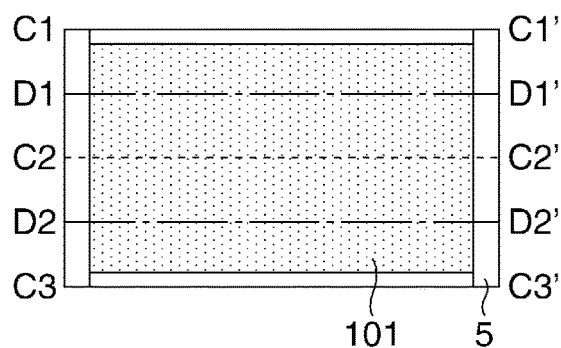

FIG. 6C shows the arrangement of the bonding layer 4 in the comparative example 3. In the comparative example 3, two band-shaped unbonded regions are provided close to the respective antinodal lines C1-C1' and C3-C3' in the out-of plane vibration mode A. When the unbonded area ratio of the two band-shaped unbonded regions was 9.8%, a value of $\Delta fc3/\Delta f0$ was 0.915.

Figure 6D:
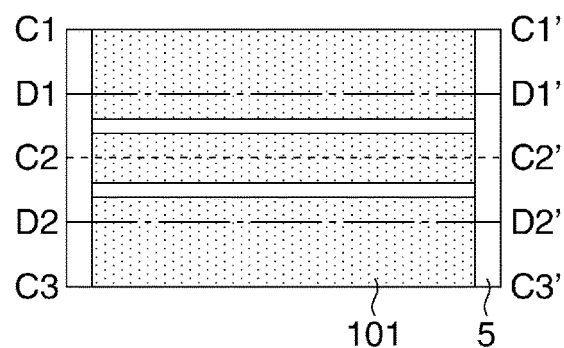

FIG. 6D shows the arrangement of the bonding layer 4 in the comparative example 4. In the comparative example 4, two band-shaped unbonded regions extending in the X direction are provided in a midsection between the antinodal line C2-C2' and the nodal line D1-D1' and a midsection between the antinodal line C2-C2' and the nodal line D2-D2' in the out-of plane vibration mode A, respectively. When the unbonded area ratio of the two band-shaped unbonded regions was 9.8%, a value of $\Delta fc4/\Delta f0$ was 0.991.

Figure 6E:
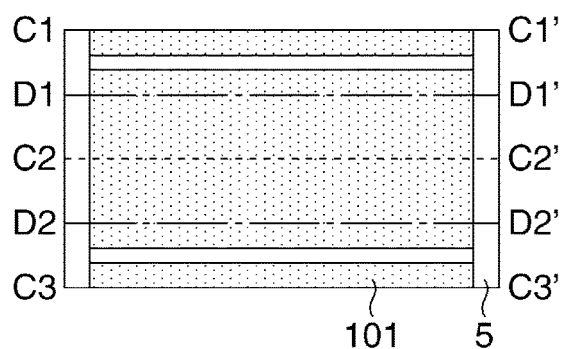

FIG. 6E shows the arrangement of the bonding layer 4 in the comparative example 5. In the comparative example 5, two band-shaped unbonded regions extending in the lengthwise direction (the X direction) of the piezoelectric ceramic 1 are provided in a midsection between the antinodal line C1-C1' and the nodal line D1-D1' and a midsection between the antinodal line C3-C3' and the nodal line D2-D2' in the out-of plane vibration mode A, respectively. When the unbonded area ratio of the two band-shaped unbonded regions was 9.8%, a value of $\Delta fc5/\Delta f0$ was 0.994.

Figure 6F:
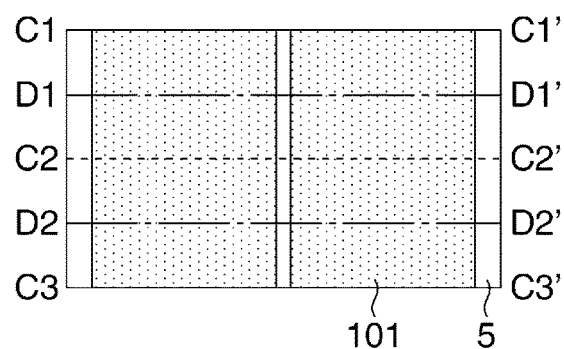

FIG. 6F shows the arrangement of the bonding layer 4 in the comparative example 6. In the comparative example 6, one band-shaped unbonded region extending in the crosswise direction (the Y direction) of the piezoelectric ceramic 1 and crossing the nodal lines and the antinodal lines in the out-of-plane vibration mode A is provided in a central part in the lengthwise direction (the X direction) of the piezoelectric ceramic 1. When the unbonded area ratio of the one band-shaped unbonded region was 5.0%, a value of $\Delta fc6/\Delta f0$ was 0.959.

Figure 7A:
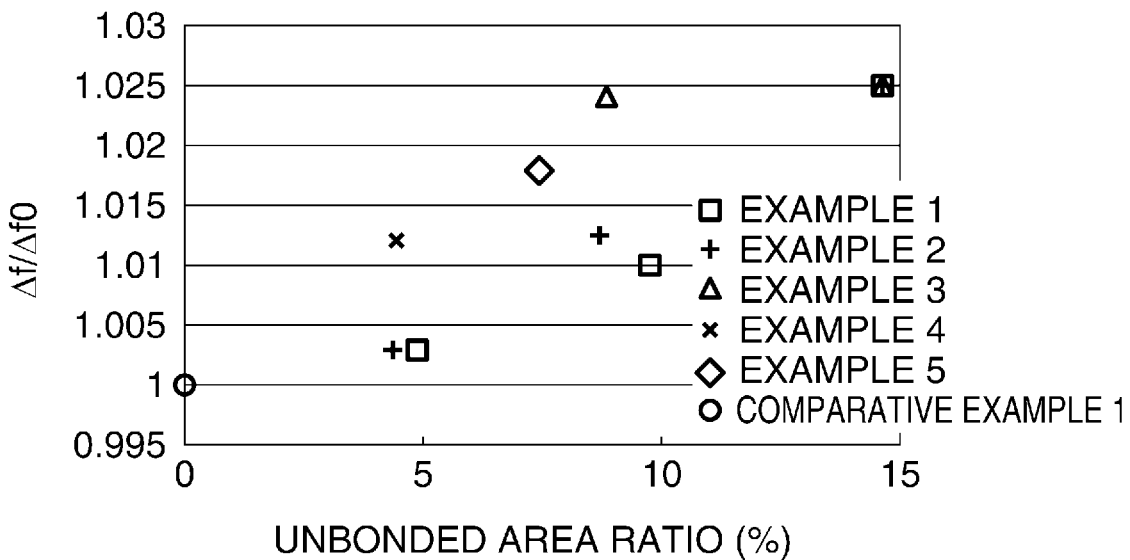
FIGS. 7A and 7B are diagrams showing the relationship between unbonded area ratios and values of $\Delta f$ in the examples and the comparative examples.
Figure 7B:
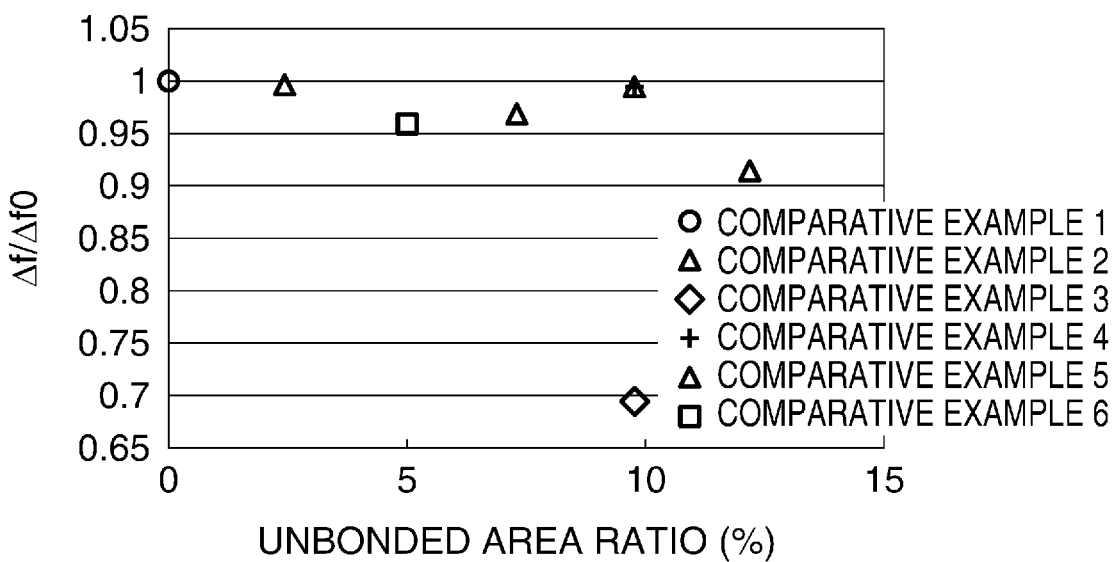

FIG. 7A is a diagram showing the relationship between the unbonded area ratios in the examples 1 to 5 and the values of $\Delta fex/\Delta f0$. FIG. 7B is a diagram showing the relationship between the unbonded area ratios in the comparative examples 1 to 6 and the values of $\Delta fc/\Delta f0$. It should be noted that in the examples 1 to 3, the widths (lengths in the Y direction) and lengths (lengths in the X direction) of the band-shaped unbonded regions were changed for adjustment so that shapes of the band-shaped unbonded regions could become identical when the unbonded area ratio reached 14.6%.

Referring to FIGS. 7A and 7B, when the value of $\Delta fex/\Delta f0$ is larger than one, this means that there is a big resonance frequency difference $\Delta f$ between the out-of-plane vibration modes A and B, that is, the effect of reducing power consumption is great. On the other hand, when the value of $\Delta fex/\Delta f0$ is smaller than one, this means that there is only a small resonance frequency difference $\Delta f$ between the out-of-plane vibration modes A and B, that is, the effect of reducing power consumption cannot be achieved. Thus, it can be seen that power consumption is reduced when the unbonded area ratio is increased by providing unbonded regions in regions with the nodal lines in the out-of-plane vibration mode A at their centers as in the examples 1 to 5. On the other hand, it can be seen that the effect of reducing power consumption cannot be achieved when unbonded regions are provided in regions with the antinodal lines in the out-of-plane vibration mode A at their centers as in the comparative examples 2 to 6.

It should be noted that in a case where the vibrator 100 has the projecting portions 51 as shown in FIGS. 2A to 2D, and insides of the projecting portions 51 are hollow, regions inside the projecting portions 51 are unbonded regions which are not bonded to the piezoelectric element 101. In this case, unbonded regions inside the projecting portions 51 with an unbonded area ratio of about 20% are allowed to be present in addition to the unbonded regions in the examples 1 to 5. Namely, even if unbonded regions are additionally formed inside the projecting portions 51, the resonance frequency difference $\Delta f$ would be larger than that in the comparative example 1 as long as the unbonded regions in the examples 1 to 5 are formed. However, if the total unbonded area ratio is excessively high, there may be problems that, for example, vibrations excited in the piezoelectric element 101 are less likely to be transmitted to the elastic body 5, or the vibrator 100 tends to be broken (the piezoelectric element 101 and the elastic body 5 tend to peel off each other). It is thus preferred that the unbonded area ratio which is a ratio of an area of unbonded regions to an area of the piezoelectric ceramic 1 which is opposed to the elastic body 5 is less than 40% in total.

As described earlier, the elastic body 5 is made of a metallic member such as stainless steel. Here, if the Young's modulus of the elastic body 5 is low, a neutral plane of bending vibration in the vibrator 100 shifts from the elastic body 5 side to the piezoelectric ceramic 1 side, and as a result, the amount of vibration displacement of the vibrator 100 may decrease. It is thus preferred that the Young's modulus Yce of the piezoelectric ceramic 1 at a temperature of 20° C. and the Young's modulus Ysb of the elastic body 5 at a temperature of 20° C. has the following relationship, Yce<Ysb. The reason why the temperature of 20° C. is taken as an example here is that an average value of typical temperatures at which the general vibrator 100 is used is taken into account. It should be noted that when the Young's modulus of the elastic body 5 is low, the neutral plane could be adjusted toward elastic body 5 side by increasing the thickness of the elastic body 5, but this would increase the size of the vibrator 100. From the viewpoint of downsizing the vibrator 100, it is preferred that the elastic body 5 is made of a material with the Young's modulus higher than that of the piezoelectric ceramic 1.

Furthermore, it is preferred that in the vibrator 100, a length percentage Nn (%) of an unbonded region in the lengthwise direction of the two nodal lines in the out-of-plane vibration mode A is larger than a length percentage Na (%) of an unbonded region in the lengthwise direction of the antinodal line located in the midsection between the two nodal lines. The reason for this is that as an apparent stiffness of the piezoelectric ceramic 1 located on top of the nodal lines in the out-of-plane vibration mode A decreases, the resonance frequency in the out-of-plane vibration mode A selectively lowers as compared to the resonance frequency in the out-of-plane vibration mode B, causing the resonance frequency difference Δf to increase. In the comparative examples 1 to 6, the relationship Nn≤Na holds, while in the examples 1 to 5, the condition Nn>Na is satisfied. Moreover, in general, as the symmetry decreases and as the shape of the piezoelectric element 101 becomes more complicated, more vibration modes present themselves. For this reason, from the viewpoint of reducing the occurrence of vibrations in vibration modes other than desired vibration modes, it is preferred that unbonded regions are provided symmetrically with respect to an XZ plane or YZ plane passing through a center of the piezoelectric element 101.

The present invention was developed with the aim of reducing power consumption in causing desired vibration displacement of a vibrator employing a lead-free piezoelectric ceramic, but as described above, the present invention is characterized by the forms of the bonding layer 4, not a piezoelectric material itself. For this reason, the forms of the bonding layer 4 in the examples 1 to 5 described above may be applied not only to a vibrator employing a lead-free piezoelectric ceramic but also to a vibrator employing a lead-based piezoelectric ceramic. Namely, by introducing the forms of the bonding layer 4 illustrated in the examples 1 to 5 into a vibrator employing a lead-based piezoelectric ceramic, power consumption is reduced as compared to the conventional arts.

Figure 8:
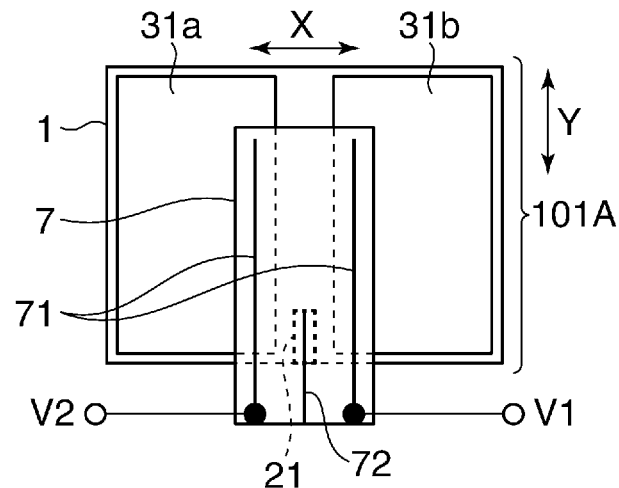
FIG. 8 is a plan view schematically showing a variation of the piezoelectric element in FIGS. 1A to 1D.

A description will now be given of a variation of the piezoelectric element 101. FIG. 8 is a plan view schematically showing an arrangement of a piezoelectric element 101A that is a variation of the piezoelectric element 101. An aspect ratio (long-side length/short-side length) of the piezoelectric element 101A differs from that of the piezoelectric element 101, but the aspect ratio of the piezoelectric element 101A is not limited as long as vibrations in the out-of-plane vibration modes A and B can be excited at the same time. A shape of the elastic body 5 joined to the piezoelectric element 101A is allowed to be designed according to a shape of the piezoelectric element 101A.

The piezoelectric element 101A has an arrangement in which a common electrode 21 (first electrode) is provided on one surface of the piezoelectric ceramic 1, driving electrodes 31a, 31b (second electrodes) are provided on the other surface of the piezoelectric ceramic 1, and a feeding member 7 is mounted on the surface of the piezoelectric ceramic 1 on which the driving electrodes 31a and 31b are provided. In the piezoelectric element 101A, the surface on which the common electrode 21 is formed is bonded to an elastic body, not shown, via a bonding layer, not shown, and the bonding layer has any of the forms in the examples 1 to 5 described above. FIG. 8 does not show the whole of the common electrode 21. The common electrode 21 is formed on substantially the entire surface of the piezoelectric ceramic 1 which is opposite to the surface on which the driving electrodes 31a and 31b are formed, and is pulled out along a side of the piezoelectric ceramic 1 from a central part of the piezoelectric ceramic 1 in the lengthwise direction up to the surface on which the driving electrodes 31a and 31b are formed. The driving electrodes 31a and 31b are formed with a predetermined space left therebetween in the X direction so that an area from which the common electrode 21 is pulled out can be provided on the surface on which the driving electrodes 31a and 31b are formed.

The feeding member 7 is, for example, a flexible printed-circuit board, and includes feeding wires 71 and a grounding wire 72. The feeding member 7 is mounted on the surface of the piezoelectric ceramic 1 on which the driving electrodes 31a and 31b are provided so that the feeding wires 71 can be electrically connected to the driving electrodes 31a and 31b, and the grounding wire 72 can be electrically connected to the area from which the common electrode 21 is pulled out.

Through the feeding wires 71 of the feeding member 7, an AC voltage V1 is applied from a power source to the driving electrode 31b, and at the same time, an AC voltage V2 with the same absolute value of the amplitude (voltage) as that of the AC voltage V1 is applied from the power source to the driving electrode 31a. Here, when the AC voltages V1 and V2 are in phase with each other at a frequency close to the resonance frequency fA in the out-of-plane vibration mode A, the whole piezoelectric element 101A (the driving electrodes 31a, 31b) expand and contract. As a result, a vibration in the out-of-plane vibration mode A is generated in a vibrator for which the piezoelectric element 101A is used. When the AC voltages V1 and V2 are 180° out of phase with each other at a frequency close to the resonance frequency fB in the out-of-plane vibration mode B, areas in the piezoelectric element 101A where the respective driving electrodes 31a and 31b are formed become deformed such that one expands while the other contracts. As a result, a vibration in the out-of-plane vibration mode B is generated in the vibrator for which the piezoelectric element 101A is used. The frequencies at which the vibrations in the out-of-plane vibration modes A and B are thus individually excited are measured with, for example, an impedance analyzer to measure the resonance frequencies fA and fB in the respective out-of-plane vibration modes A and B.

When a phase difference θ between the AC voltages V1 and V2 is between 0° and 180° (0°<θ<180°), vibrations in the respective out-of-plane vibration modes A and B are excited at the same time in a state of being 90° out of phase with each other (a phase difference between the vibrations is always 90° or −90°). Amplitudes of the respective out-of-plane vibration modes A and B are adjusted by changing the phase difference θ between the AC voltages V1 and V2.

Figure 9:
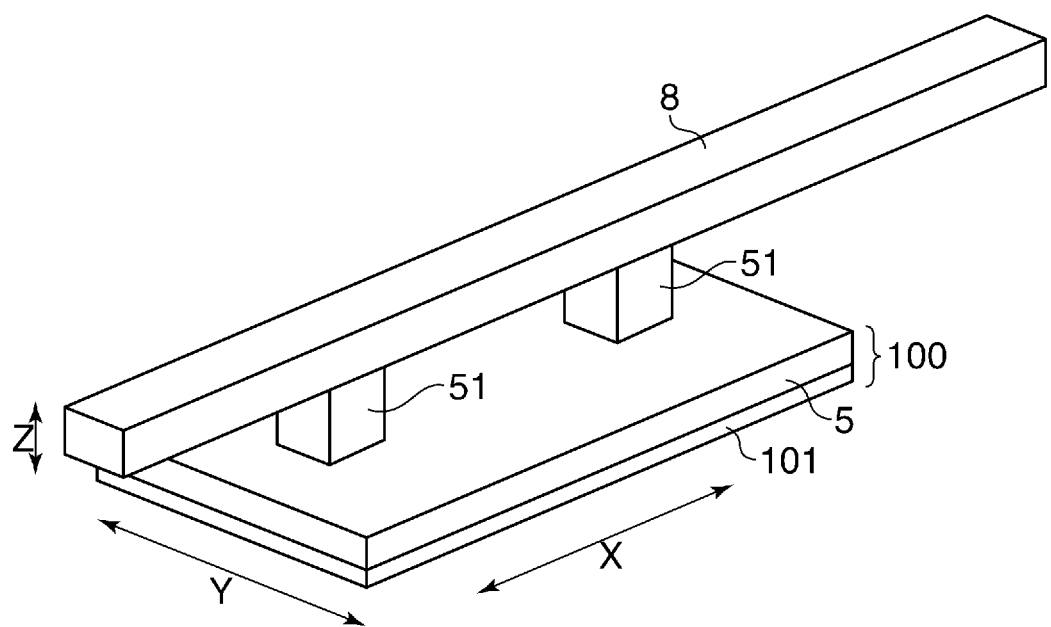
FIG. 9 is a perspective view schematically showing an arrangement of a vibration-type actuator.

A description will now be given of a concrete example of a vibration-type actuator for which the vibrator 100 (100A) is used. FIG. 9 is a perspective view schematically showing an arrangement of the vibration-type actuator. The vibrator 100 constituting the vibration-type actuator has the construction shown in FIGS. 2A and 2B and has an arrangement in which a driven body 8 is in contact with the ends of the projecting portions 51 in the Z direction. It is preferred that the two projecting portions 51 are provided symmetrical with respect to the XZ plane or YZ plane passing through the center of the elastic body 5, and this maintains a stable state of contact because reactive force which the vibrator 100 receives from the driven body 8 at the projecting portions 51 is less unbalanced.

As described above with reference to FIG. 8, the vibrations in the respective out-of-plane vibration modes A and B which are 90° out of phase with each other are excited in the vibrator 100. This produces oval motions within the ZX plane at the ends of the projecting portions 51, and the driven body 8 receives thrust from the projecting portions 51 through the oval motions produced at the ends of the projecting portions 51. This enables the vibrator 100 and the driven body 8 to move relatively to each other in the X direction. It is preferred that the two projecting portions 51 are provided on the antinodal line in the out-of-plane vibration mode A and on the nodal lines in the out-of-plane vibration mode B, and it is also preferred that the ends of the projecting portions 51 and the driven body 8 are in pressure contact with each other at a predetermined pressure. As a result, through the oval motions produced at the ends of the projecting portions 51 due to the vibrations generated in the vibrator 100, thrust is efficiently applied to the driven body 8.

A description will now be given of an optical apparatus employing the vibrator 100. By dynamically connecting a moving body in the vibration-type actuator shown in FIG. 9 to an optical member, the optical member is moved in a predetermined direction. It should be noted that the dynamic connection means a state in which members are in direct contact with each other or in contact with each other via another member such that a force produced by a coordinate variation, volume change, or shape change of one member is transmitted to the other member. It should be noted that in the vibration-type actuator, one of the vibrator 100 and the driven body 8 is fixed at a predetermined position while the other one is moving, and therefore, the moving body mentioned above means one of the vibrator 100 and the driven body 8 which actually moves.

Figure 10:
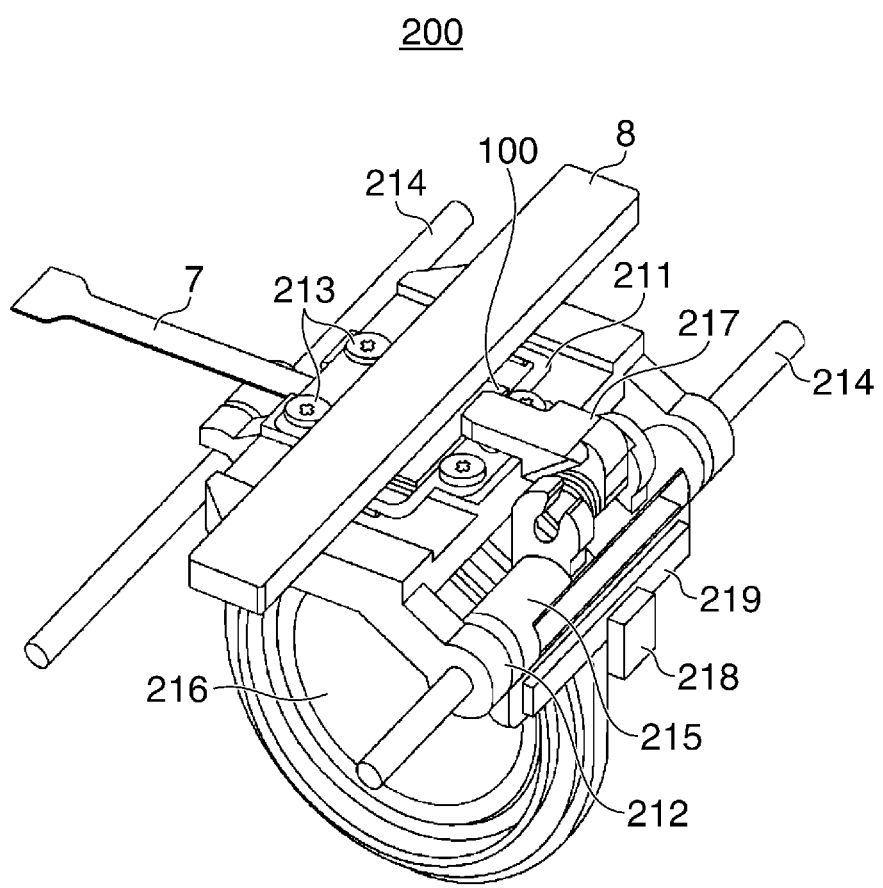
FIG. 10 is a perspective view schematically showing an optical apparatus equipped with the vibration-type actuator.

FIG. 10 is a perspective view schematically showing the optical apparatus 200. The optical apparatus 200 is specifically a mechanism that moves a focus lens, which is placed inside a lens barrel of an image pickup apparatus such as a digital camera or a digital video camera, in a direction of a shooting optical axis. In the optical apparatus 200, the driven body 8 with a rectangular shape is in pressure contact with the vibrator 100, and the driven body 8 is fixed at a predetermined position inside the lens barrel in which the optical apparatus 200 is placed.

The vibrator 100 (the elastic body 5 of the vibrator 100) is held on a holding member 211 by welding or the like so as to prevent occurrence of undesired vibrations. A moving cabinet 212 is fixed to the holding member 211 with screws 213, and as a result, the holding member 211, the moving cabinet 212, and the vibrator 100 are configured as an integral unit. The moving cabinet 212 is slidably fitted on two guide members 214 fixed to a predetermined position in the lens barrel and is movable in a lengthwise direction of the guide members 214.

A lens holding member 215 holds the focus lens 216 and is slidably fitted on the two guide members 214 such that an optical axis of the focus lens 214 is substantially parallel to the lengthwise direction of the guide members 214. A connecting member 217 is mounted on the holding member 211 and connects the lens holding member 215 to the moving cabinet 212 so as to prevent the lens holding member 215 from the guide member 125 from wobbling in the lengthwise direction of the guide members 214. This enables the lens holding member 215 to smoothly move integrally with the moving cabinet 212 in the lengthwise direction of the two guide members 214.

When a predetermined AC voltage is supplied from a power source, not shown, through the feeding member 7 connected to the vibrator 100, oval motions are produced in the projecting portions 51 (not shown in FIG. 10) of the vibrator 100 as described earlier with reference to FIGS. 8 and 9. As a result, the moving cabinet 212, the lens holding member 215, the holding member 211, and the vibrator 100 are integrally guided by the guide members 214 to move in a lengthwise direction of the driven body 8. Namely, by moving the focus lens 216 held by the lens holding member 215 in the direction of the optical axis, a focusing operation is performed to bring a subject into focus.

It should be noted that a scale 219 is attached to a side of the lens holding member 215, and when the vibrator 100 is actuated, positional information on the scale 219 is read by a sensor 218 fixed at a predetermined position in the lens barrel. The positional information read by the sensor 218 is sent to a control device, not shown, which controls the power source, and the control device controls voltage and phase of AC voltage supplied from the power source to the vibrator 100. This enables the focus lens 216 (the lens holding member 215) to move to a predetermined position in the direction of the optical axis.

It should be noted that although in the embodiment described above, the piezoelectric element 101 having the first electrode 2 and the second electrodes 3a and 3b formed on the piezoelectric ceramic 1 having the flat and substantially rectangular shape is taken up as an example, an arrangement of a piezoelectric element employing the piezoelectric ceramic described above is not limited to this. Namely, the shape of the piezoelectric ceramic is limited neither to a rectangular shape nor to a flat shape, but may be designed in any shape as long as desired vibrations can be excited. Further, a piezoelectric element capable of exciting desired vibrations may be implemented by forming electrodes in an arrangement different from that in FIGS. 1B and 1C on the piezoelectric ceramic 1 having the flat and substantially rectangular shape.

In the embodiment described above, the image pickup apparatus equipped with the mechanism that moves the focus lens 216 in the direction of the shooting optical axis by means of the vibration-type actuator is taken up as an example of the electronic apparatus employing the vibration-type actuator. The vibration-type actuator, however, may also be applied to a mechanism that moves a zoom lens in the direction of the shooting optical axis in the image pickup apparatus, and a mechanism that drives an image stabilization lens, which is placed in the lens barrel so as to correct for an image blur, within a plane perpendicular to the shooting optical axis in the image pickup apparatus. Further, the vibration-type actuator may also be applied to a mechanism that corrects for image blur by driving an image pickup device, which is mounted on a main body of the image pickup apparatus, within a plane parallel to a light-incident plane. The vibration-type actuator should not necessarily be applied to the image pickup apparatus but may be used for driving mechanisms that drive members required to be positioned in a variety of electronic apparatuses, and this reduces power consumption of the electronic apparatuses.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-087153, filed Apr. 26, 2017 and Japanese Patent Application No. 2018-079885, filed Apr. 18, 2018, which are hereby incorporated by reference herein in their entirety.

What is claimed is:

1. A vibrator comprising:
   a piezoelectric element configured to have a piezoelectric ceramic and electrodes; and
   an elastic body,
   wherein the piezoelectric element and the elastic body are bonded together via a bonding layer, and
   wherein in a region close to a nodal line of vibration in a primary out-of-plane vibration mode of the vibrator, there is a band-shaped unbonded region where the piezoelectric element and the elastic body are not bonded together.

2. The vibrator according to claim 1, wherein a ratio of an area of the band-shaped unbonded region to a total area of a bonding surface of the piezoelectric element which is bonded to the elastic body is less than 40%.

3. The vibrator according to claim 1, wherein a Young's modulus of the elastic body at a temperature of 20° C. is higher than a Young's modulus of the piezoelectric ceramic at a temperature of 20° C.

4. The vibrator according to claim 1, wherein the region close to the nodal line is a region closer to the nodal line than to an antinodal line of vibration in the primary out-of-plane vibration mode and includes the nodal line.

5. The vibrator according to claim 1, wherein the band-shaped unbonded region is a region with a width of not more than $0.073\lambda$ for each of two nodal lines in a direction crossing the nodal line with respect to a wavelength $\lambda$ in the primary out-of-plane vibration mode.

6. The vibrator according to claim 4, wherein a length percentage Nn (%) of a band-shaped unbonded region in the lengthwise direction of two nodal lines is larger than a length percentage Na (%) of a band-shaped unbonded region in the lengthwise direction of an antinodal line located in the midsection between the two nodal lines.

7. The vibrator according to claim 1, wherein;
   the piezoelectric element and the elastic body each have a substantially flat and substantially rectangular shape, and
   when a vibration in the primary out-of-plane vibration mode is excited in the vibrator, a nodal line of the vibration appears substantially parallel to a long side of the piezoelectric element.

8. A vibration-type actuator comprising:
   the vibrator according to claim 1; and
   a driven body configured to be in contact with the vibrator.

9. An electronic apparatus comprising:
   the vibration-type actuator according to claim 8; and
   a member configured to be in contact with the vibration-type actuator.

10. The vibrator according to claim 1, wherein the piezoelectric element includes a piezoelectric ceramic with a lead content of less than 1000 ppm.

* * * * *